US011791178B1

(12) United States Patent
Tang et al.

(10) Patent No.: US 11,791,178 B1
(45) Date of Patent: Oct. 17, 2023

(54) COMPLIANT MECHANICAL SYSTEM FOR MINI/MICRO CHIP MASS TRANSFER AND PACKAGING

(71) Applicant: GUANGDONG UNIVERSITY OF TECHNOLOGY, Guangzhou (CN)

(72) Inventors: Hui Tang, Guangzhou (CN); Zhishen Liao, Guangzhou (CN); Xin Chen, Guangzhou (CN); Zhihang Lin, Guangzhou (CN); Jian Gao, Guangzhou (CN); Qiang Liu, Guangzhou (CN); Xun Chen, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/062,026

(22) Filed: Dec. 6, 2022

(30) Foreign Application Priority Data

Feb. 18, 2022 (CN) .......................... 202210151547.6

(51) Int. Cl.
*H01L 21/67* (2006.01)

(52) U.S. Cl.
CPC .. *H01L 21/67144* (2013.01); *H01L 21/67259* (2013.01)

(58) Field of Classification Search
CPC ....... H01L 21/67; B25J 9/0015; B25J 9/1065; B25J 9/003
USPC ...................................................... 74/479.01
See application file for complete search history.

(56) References Cited

U.S. PATENT DOCUMENTS

| 11,302,562 B2 | 4/2022 | Wang |
| 11,335,583 B2 | 5/2022 | Chen |
| 11,437,265 B2 | 9/2022 | Dong et al. |
| 2020/0105551 A1 | 4/2020 | Wendt et al. |

FOREIGN PATENT DOCUMENTS

| CN | 104308831 A | 1/2015 |
| CN | 209104125 U | 7/2019 |
| CN | 110165038 A | 8/2019 |
| CN | 110224052 A | 9/2019 |
| CN | 111128799 A | 5/2020 |
| CN | 210959146 U | 7/2020 |
| CN | 111916374 A | 11/2020 |
| CN | 213660378 U | 7/2021 |
| CN | 113937039 A | 1/2022 |

*Primary Examiner* — Ronald P Jarrett
(74) *Attorney, Agent, or Firm* — True Shepherd LLC; Andrew C. Cheng

(57) ABSTRACT

A compliant mechanical system for Mini/Micro chip mass transfer and packaging comprises a flexure-based continuous ejector pin mechanism including a drive support plate, a mounting base, first thorn die attach drive devices, second thorn die attach drive devices, first flexible hinges, second flexible hinges, and a pricking pin. The first thorn die attach drive devices and the second thorn die attach drive devices are mounted on the drive support plate. A drive end of the first thorn die attach drive device horizontally passes rightward through the first flexible hinge at a corresponding position; a drive end of the second thorn die attach drive device horizontally passes leftward through the first flexible hinge at a corresponding position; and the mounting base is hinged to the drive ends of the two thorn die attach drive devices through the second flexible hinges.

6 Claims, 5 Drawing Sheets

COMPLIANT MECHANICAL SYSTEM FOR MINI/MICRO CHIP MASS TRANSFER AND PACKAGING

CROSS REFERENCE TO RELATED APPLICATION

This application claims priority to the Chinese Patent Application No. 202210151547.6 with a filing date of Feb. 18, 2022. The content of the aforementioned application, including any intervening amendments thereto, is incorporated herein by reference.

TECHNICAL FIELD

The present disclosure relates to the field of Mini/Micro-LED die transfer and packaging, and in particular, to a compliant mechanical system for Mini/Micro chip mass transfer and packaging.

BACKGROUND

In the post-Moore era, new-generation die devices are developing towards high density, miniaturization, thinness, and high integration. What is particularly prominent is Mini/Micro light-emitting diode (LED) array transfer and packaging that have attracted the attention of main packaging giants. Mini/Micro-LED array transfer and packaging require millions or even tens of millions of micron-scale LED grains to be correctly and efficiently moved onto a circuit substrate. Taking a 4K television as an example, as high as 24 million (4000×2000×R/G/B three-color calculation) grains needing to be transferred. Even if 10,000 grains are transferred at a time, the operation needs to be repeated 2,400 times. The existing equipment, procedures and processes cannot meet the needs of Mini/Micro-LED mass production. The production cost is high, and the production efficiency is very low. To transfer dense dies on a wafer on a large scale, and accurately enlarge a spacing to a target attachment position of the substrate, the difficulty of executing the system with large strokes, high precision, and high speed may also increase exponentially. Therefore, how to implement the high-speed, high-precision and high-efficiency transfer of Mini/Micro-LED dies is a key technical bottleneck in the current industry.

The conventional die transfer technologies all employ a Pick & Place mode. Because the die size of Mini/Micro-LED is less than 200 microns, and in the Pick & Place mode, the aperture of a nozzle cannot be within 200 um, and in addition, the Mini/Micro-LED requires ultra-high speed, none of the conventional die transfer modes and equipment can serve industrial mass production. However, a pricked crystal transfer technology for flipped chips on board completely abandons the nozzle, thereby greatly improving the die transfer speed. In the existing pricked crystal transfer technology, a thimble reciprocates in a vertical direction. A motion platform moves a target die under the thimble and then stops moving. When the platform is stationary, the thimble is pressed down to push a die onto a printed circuit board to implement Mini/Micro-LED die transfer. In the existing pricked crystal transfer technology, the motion platform intermittently moves, which not only affects the transfer precision, but also limits the die transfer efficiency.

SUMMARY

In view of the above defects, an objective of the present disclosure is to provide a compliant mechanical system for Mini/Micro chip mass transfer and packaging, which can implement continuous thorn die attach operations, and improves the transfer efficiency on the premise of ensuring the transfer precision of LED chips.

To achieve the above purpose, the present disclosure provides the following technical solutions:

A compliant mechanical system for Mini/Micro chip mass transfer and packaging is provided, including a flexure-based continuous ejector pin mechanism, where the flexure-based continuous ejector pin mechanism includes a drive support plate, a mounting base, a first thorn die attach drive device, a second thorn die attach drive device, first flexible hinges, second flexible hinges, and a pricking pin; two upper hinge portions and two lower hinge portions horizontally protrude from a front side of the drive support plate; the upper hinge portions and the lower hinge portions are arranged in two groups up and down facing each other, and are respectively located on a left side and a right side of the drive support plate; the upper hinge portion is connected to the lower hinge portion directly therebelow through the first flexible hinge; the first thorn die attach drive device is mounted on the left side of the drive support plate; the first thorn die attach drive device horizontally passes through the first flexible hinge at a corresponding position; the second thorn die attach drive device is symmetrically mounted on the right side of the drive support plate; the second thorn die attach drive device horizontally passes through the first flexible hinge at a corresponding position; a left side and a right side of the mounting base are respectively hinged to the first thorn die attach drive device and the second thorn die attach drive device through the second flexible hinges; and an upper end of the pricking pin is vertically connected to a bottom of the mounting base.

Preferably, the first thorn die attach drive device is fixedly mounted on the left side of the drive support plate through an L-shaped mounting plate; the second thorn die attach drive device is fixedly mounted on the right side of the drive support plate through an L-shaped mounting plate; and the first thorn die attach drive device and the second thorn die attach drive device are collinearly arranged in a horizontal direction; and the second flexible hinges located on the left side and the right side of the drive support plate are symmetrically arranged left and right with respect to an extension direction of the pricking pin in a vertical direction.

Preferably, two of the first flexible hinges are arranged in parallel between the upper hinge portion and the lower hinge portion directly therebelow; and the second flexible hinges are respectively hinged in parallel between the first thorn die attach drive device and the mounting base and between the second thorn die attach drive device and the mounting base.

Preferably, the first thorn die attach drive device and the second thorn die attach drive device are voice coil motors.

Preferably, the first flexible hinges are straight-beam hinges, and are of linear sheet structures having a uniform width and thickness; the second flexible hinges are arc flexible hinges, and are of linear strip structures; arc-shaped grooves are recessed in both ends of the arc flexible hinges, and groove surfaces of the arc-shaped grooves are arc surfaces; an extension direction of the arc grooves is horizontally arranged perpendicular to the drive support; and the first flexible hinges and the second flexible hinges are all made of aviation aluminum.

Preferably, the compliant mechanical system for Mini/Micro chip mass transfer and packaging further includes: a portal frame, a first motion platform, a worktable, a second motion platform, and an industrial camera, where the first motion platform is configured to bear a circuit substrate; the worktable is configured to heat and fix welding between an LED die and the circuit substrate; the second motion platform is configured to bear the LED die and move directly above the first motion platform; the industrial camera is configured to detect relative positions between the circuit substrate and each LED die; the flexure-based continuous ejector pin mechanism is configured to transfer the LED die on the second motion platform to the circuit substrate on the first motion platform; and the portal frame is mounted directly above the first motion platform; and the industrial camera and the flexible flexure-based continuous ejector pin mechanism are mounted on the portal frame.

Preferably, the compliant mechanical system for Mini/Micro chip mass transfer and packaging further includes a controller, where the controller is connected to the first thorn die attach drive device, the second thorn die attach drive device, the first motion platform, the worktable, the second motion platform, and the industrial camera.

Preferably, the LED die is a Mini-LED die or a Micro-LED die.

Preferably, the controller is internally provided with a thorn die attach control method for transferring and packaging LED dies; and the thorn die attach control method includes the following steps:

representing an output bit of the pricking pin as:

$$\begin{cases} X = \dfrac{(X_1 + X_2)}{2} \\ Y = \dfrac{(X_1 - X_2)\tan\theta}{2} \end{cases};$$

wherein, $X_1$ is an input displacement of the first thorn die attach drive device, $X_2$ is an input displacement of the second thorn die attach drive device; x is an output displacement of the pricking pin in the horizontal direction, y is an output displacement of the pricking pin in the horizontal direction, and θ is an included angle between the second flexible hinge and the vertical direction.

The embodiments of the present disclosure have the following beneficial effects:

Two voice coil motors are used as thorn die attach drive devices in a flexure-based continuous ejector pin mechanism, and a novel flexible mechanism is designed as a transmission mechanism, such that in a thorn die attach operation of a pricking pin, the pricking pin can not only reciprocate in the vertical direction, but also reciprocate in the horizontal direction. When the motion platform of the rapid transfer and packaging system moves at a constant speed, the thimble can keep a horizontal motion at the same speed with the motion platform during the contact with the die, and the motion platform changes from an intermittent motion to a uniform motion. During the uniform motion, the continuous thorn die attach operations can be implemented, thereby improving the thorn die attach efficiency of LED dies.

100-flexure-based continuous ejector pin mechanism, 110-drive support plate, 111-upper hinge portion, 112-lower hinge portion, 120-mounting base, 130-first thorn die attach drive device, 140-second thorn die attach drive device, 150-first flexible hinge, 160-second flexible hinge, 161-arc-shaped groove, 180-pricking pin, 210-first motion platform, 220-second motion platform, 230-circuit substrate, and 300-LED die.

DETAILED DESCRIPTION OF THE EMBODIMENTS

The technical solutions of the present disclosure will be described in more detail below with reference to the accompanying drawings and specific implementations.

Figure 1:
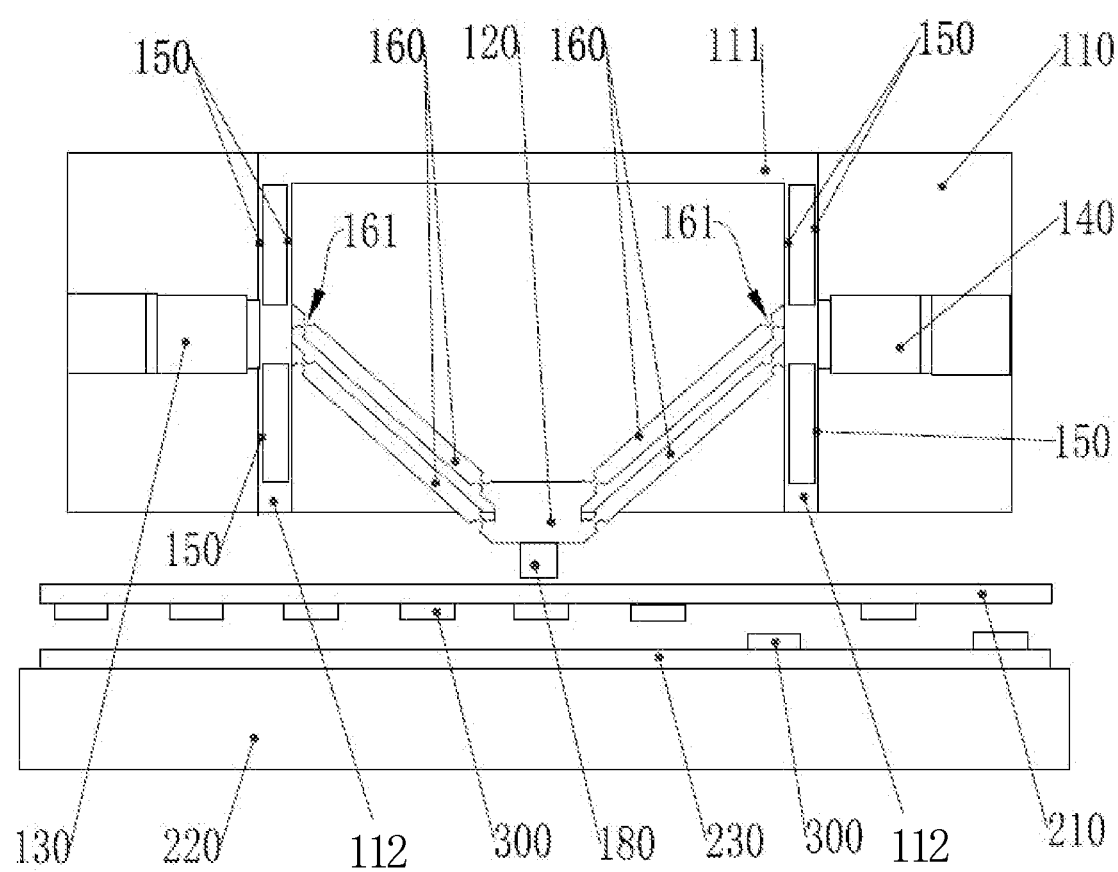
FIG. 1 is a schematic structural diagram of a rapid transfer and packaging system according to one embodiment of the present disclosure.
Figure 2:
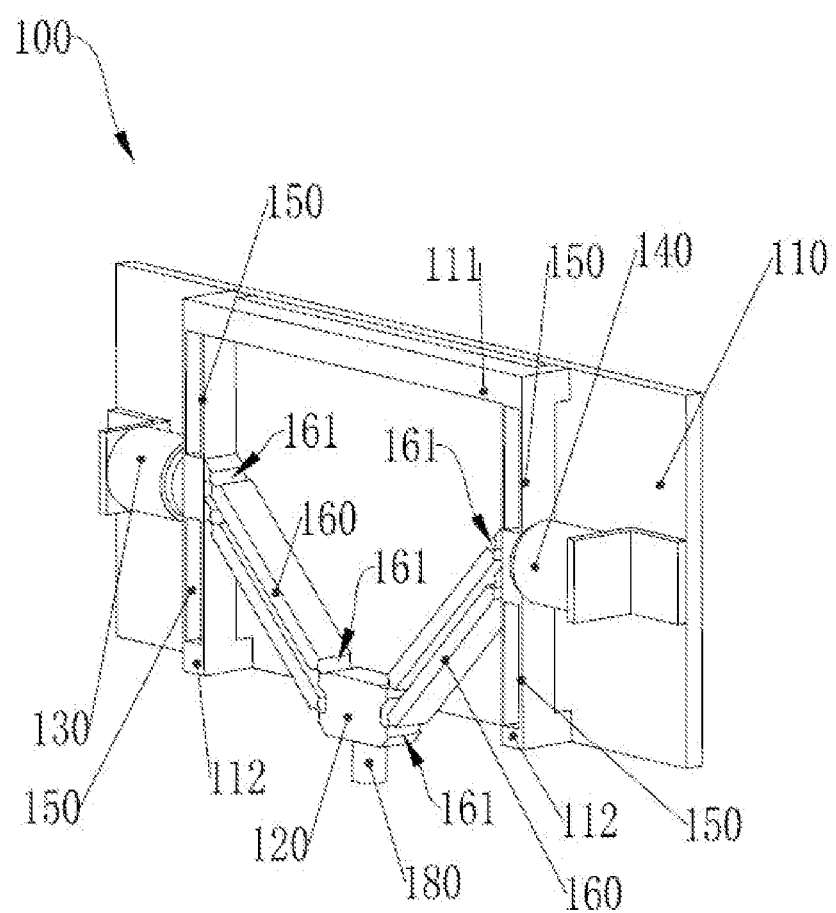
FIG. 2 is a schematic structural diagram of a flexure-based continuous ejector pin mechanism according to one embodiment of the present disclosure.
Figure 3:
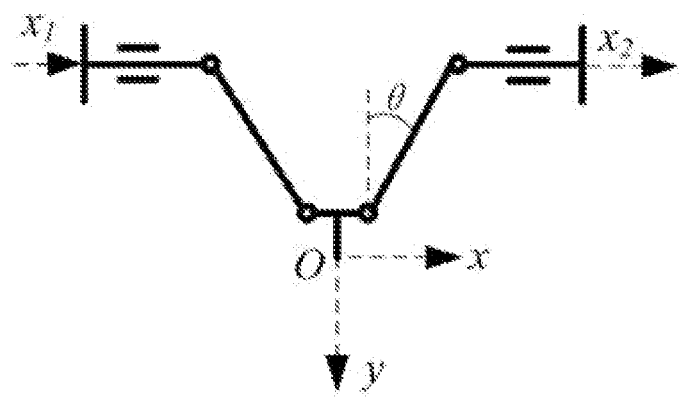
FIG. 3 is a schematic diagram of drive and displacement of a pricking pin according to one embodiment of the present disclosure[[;]].
Figure 4:
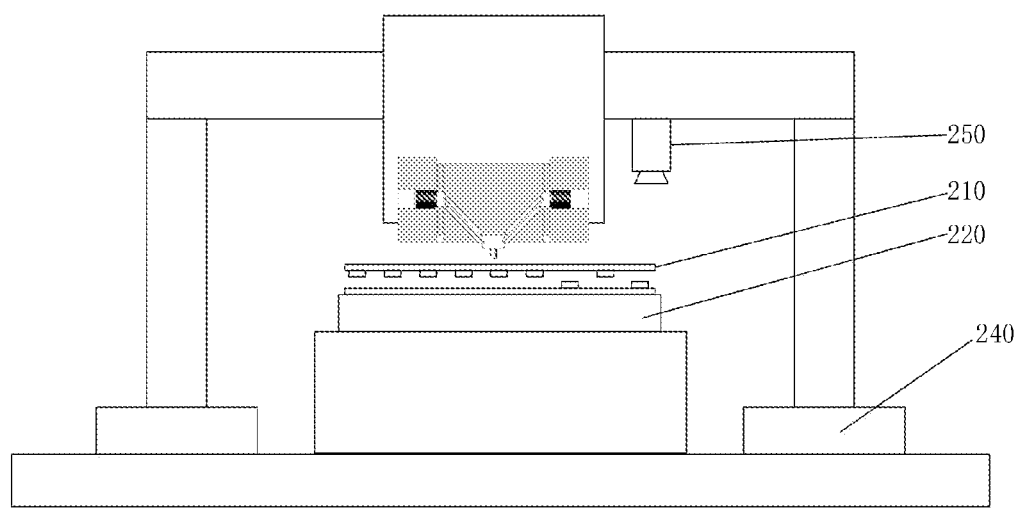
Figure 5:
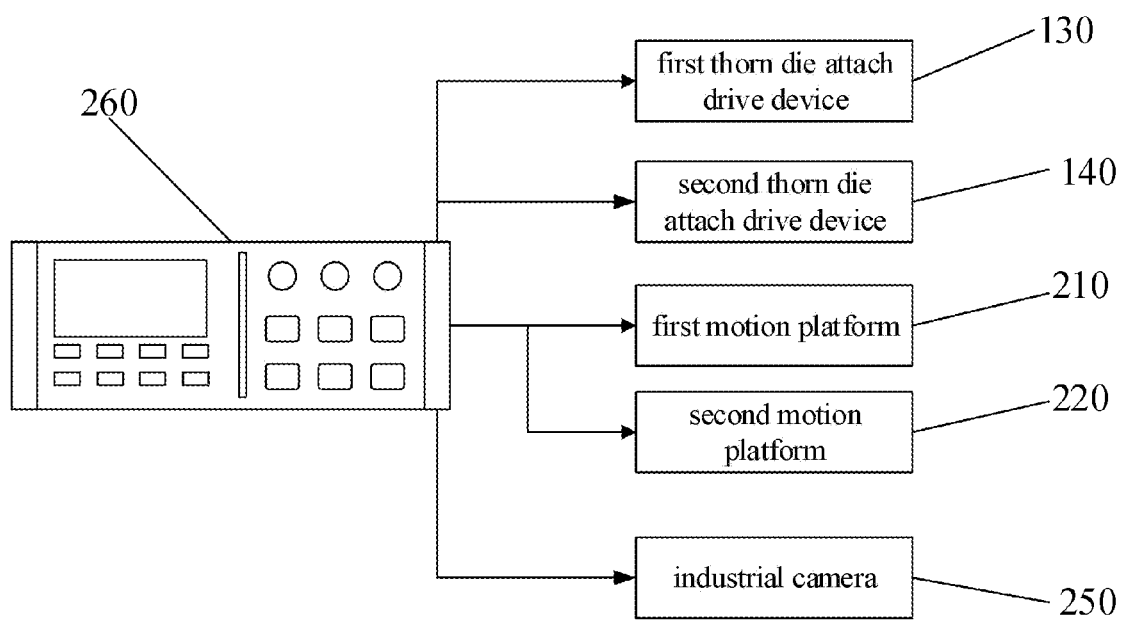

According to one embodiment of the present disclosure, as shown in FIG. 1 to FIG. 3, the compliant mechanical system for Mini/Micro chip mass transfer and packaging includes a portal frame, a first motion platform 210, a worktable, a second motion platform 220, an industrial camera, and a flexure-based continuous ejector pin mechanism 100. The first motion platform is configured to bear a circuit substrate 230. The worktable is configured to heat and fix welding between an LED die 300 and the circuit substrate 230. The second motion platform 220 is configured to bear the LED die 300, and move directly above the first motion platform 210. The industrial camera is configured to detect relative positions between the circuit substrate 230 and each LED die 300. The flexure-based continuous ejector pin mechanism 100 is configured to transfer the LED die 300 on the second motion platform 220 to the circuit substrate 230 on the first motion platform 210. The portal frame is mounted directly above the first motion platform 210. The industrial camera and the flexure-based continuous ejector pin mechanism 100 are mounted on the portal frame.

The flexure-based continuous ejector pin mechanism 100 includes a drive support plate 110, a mounting base 120, a first thorn die attach drive device 130, a second thorn die attach drive device 140, first flexible hinges 150, second flexible hinges 160, and a pricking pin 180. Two upper hinge portions 111 and two lower hinge portions 112 horizontally protrude from a front side of the drive support plate 110. The upper hinge portions 111 and the lower hinge portions 112 are arranged in two groups up and down facing each other, and are respectively located on a left side and a right side of the drive support plate 110. The upper hinge portion 111 is connected to the lower hinge portion 112 directly below through the first flexible hinge 150. The first thorn die attach drive device 130 is mounted on the left side of the drive support plate 110; and the first thorn die attach drive device 130 horizontally passes through the first flexible hinge 150 at a corresponding position. The second thorn die attach drive device 140 is symmetrically mounted on the right side of the drive support plate 110; and the second thorn die attach drive device 140 horizontally passes through the first flexible hinge 150 at a corresponding position. A left side and a right side of the mounting base 120 are respectively hinged to the first thorn die attach drive device 130 and the second thorn die attach drive device 140 through the second flexible hinges 160. An upper end of the pricking pin 180 is vertically connected to a bottom of the mounting base 120.

The drive support plate 110 and the mounting base 120 are connected through a flexible hinge. The first thorn die attach drive device 130 and the second thorn die attach drive device 140 can drive along the horizontal direction. When the first thorn die attach drive device 130 and the second thorn die attach drive device 140 can drive rightward along the horizontal direction, the mounting base 120 moves rightward along the horizontal direction. When the first thorn die attach drive device 130 and the second thorn die attach drive device 140 can drive leftward along the horizontal direction, the mounting base 120 moves leftward along the horizontal direction. When the first thorn die attach drive device 130 drives leftward along the horizontal direction, and the second thorn die attach drive device 140 can drive rightward along the horizontal direction, the mounting base 120 moves downward along the vertical direction. When the first thorn die attach drive device 130 drives rightward along the horizontal direction, and the second thorn die attach drive device 140 can drive leftward along the horizontal direction, the mounting base 120 moves upward along the vertical direction.

The first thorn die attach drive device 130 is fixedly mounted on the left side of the drive support plate 110 through an L-shaped mounting plate; and the second thorn die attach drive device 140 is fixedly mounted on the right side of the drive support plate 110 through an L-shaped mounting plate. The first thorn die attach drive device 130 and the second thorn die attach drive device 140 are collinearly arranged in a horizontal direction. The second flexible hinges 160 located on the left side and the right side of the drive support plate 110 are symmetrically arranged left and right with respect to an extension direction of the pricking pin 180 in the vertical direction. The flexure-based continuous ejector pin mechanism 100 can control the drive conditions of the first thorn die attach drive device 130 and the second thorn die attach drive device 140, thereby realizing precise movement of the pricking pin 180 in the horizontal direction and the vertical direction.

Two of the first flexible hinges 150 are arranged in parallel between the upper hinge portion 111 and the lower hinge portion 112 directly therebelow. The second flexible hinges 160 are respectively hinged in parallel between the first thorn die attach drive device 130 and the mounting base 120 and between the second thorn die attach drive device 140 and the mounting base 120. The first thorn die attach drive device 130 and the second thorn die attach drive device 140 can have better drive sensitivity to the mounting base 120. The mounting base 120 has a better support suspension structure and drive accuracy in the vertical direction.

The first thorn die attach drive device 130 and the second thorn die attach drive device 140 are voice coil motors.

The first flexible hinges 150 are straight-beam hinges, and are of linear sheet structures having a uniform width and thickness. The second flexible hinges 160 are arc flexible hinges, and are of linear strip structures. Arc-shaped grooves 161 are recessed in both ends of the arc flexible hinges, and groove surfaces of the arc-shaped grooves 161 are arc surfaces. An extension direction of the arc grooves 161 is horizontally arranged perpendicular to the drive support plate. The first flexible hinges 150 and the second flexible hinges 160 are all made of aviation aluminum.

The linear hinges make the suspension support structures of the first thorn die attach drive device 130 and the second thorn die attach drive device 140 more stable, and under the action of the flexible hinges, the linear hinges can provide sufficient degrees of drive freedom in the horizontal direction. The arc flexible hinges can be bent along the arc-shaped grooves 161 under the horizontal drive action of the first thorn die attach drive device 130 and the second thorn die attach drive device 140, such that the pricking pin 180 can be vertically lifted and horizontally moved accurately under the transmission of the arc flexible hinges on both sides.

The rapid transfer and packaging system further includes a controller. The controller is electrically connected to the first thorn die attach drive device 130, the second thorn die attach drive device 140, the first motion platform 210, the worktable, the second motion platform 220, and the industrial camera.

The LED die 300 is a Mini-LED die 300 or a Micro-LED die 300.

The controller is internally provided with a thorn die attach control method for transferring and packaging the LED die 300. The thorn die attach control method includes the following steps:

an output bit of the pricking pin 180 is represented as:

$$\begin{cases} X = \dfrac{(X_1 + X_2)}{2} \\ Y = \dfrac{(X_1 - X_2)\tan\theta}{2} \end{cases};$$

$X_1$ is an input displacement of the first thorn die attach drive device 130, $X_2$ is an input displacement of the second thorn die attach drive device 140; x is an output displacement of the pricking pin 180 in the horizontal direction, y is an output displacement of the pricking pin 180 in the horizontal direction, and $\theta$ is an included angle between the second flexible hinge 160 and the vertical direction; and in FIG. 3, O is a position where the lower end of the pricking pin is located.

Two voice coil motors are placed horizontally, and are guided by eight straight beam hinges and four arc-shaped hinges to convert the displacement input of the voice coil motors in the horizontal direction into the displacement of the pricking pin 180 in both the horizontal and vertical directions. The displacement of the pricking pin 180 in the vertical direction can transfer the LED die 300 onto the P circuit substrate 230 to transfer of an LED die 300 array. The displacement of the pricking pin 180 in the horizontal direction can make the pricking pin 180 maintain the same horizontal movement speed as the two motion platforms during the thorn die attach operation. Even if the two motion platforms are in a continuous moving state, the pricking pin 180 and the LED die 300 can also remain relatively stationary, thereby ensuring that the LED die 300 is not damaged during the transfer and packaging process.

It should be noted that the terms used herein are merely used for describing the specific embodiments, but are not intended to limit the exemplary embodiments of the present disclosure. As used herein, the singular forms are intended to include the plural forms as well, unless the context clearly indicates otherwise, and also, it should be understood that when the terms "include" and/or "comprise" are used in this specification, they indicate that there are features, steps, operations, devices, elements, and/or combinations thereof.

Unless otherwise specified, the relative arrangement, numerical expressions and numerical values of components and steps set forth in these examples do not limit the scope of the present disclosure. Meanwhile, it should be understood that for ease of description, each portion in the accompanying drawings is not necessarily drawn to the actual scale. The technologies, methods, and equipment known to those of ordinary skill in the art may not be discussed in detail, but where appropriate, the technologies, methods, and equipment should be regarded as part of the authorized specification. In all examples shown and discussed herein, any specific value should be interpreted as merely exemplary, rather than restrictive. Therefore, other examples of the exemplary examples may have different values. It should be noted that similar reference signs and letters represent similar items in the accompanying drawings below. Therefore, once an item is defined in one drawing, it does not need to be further discussed in subsequent drawings.

It should be understood that, in the description of the present disclosure, terms such as "front", "rear", "upper", "lower", "left", "right", "transverse", "longitudinal", "vertical", "horizontal", "top" and "bottom" indicate orientation or position relationships based on the accompanying drawings. Unless otherwise specified, these terms are merely intended to facilitate or simplify the description of the present disclosure, rather than to indicate or imply that the mentioned device or components must have a specific orientation and must be constructed and operated in a specific orientation. Therefore, they should not be construed as a limitation to the protection scope of the present disclosure. The orientation terms "inner" and "outer" refer to the inner and outer parts relative to the contour of the mentioned component.

For ease of description, spatially relative terms, such as "above", "on the upper side of", "on the upper surface of" and "on", can be used to describe the spatial positional relationship between components or features shown in the figure. It should be understood that the spatially relative terms are intended to encompass different orientations of the components in use or operation in addition to those shown in the figure. For example, if a component in the figure is inverted, it is described as a component "above other component or structure" or "on other component or structure". Therefore, the component will be positioned as "below other component or structure" or "under other component or structure". Therefore, the exemplary term "above" may include both orientations "above" and "below". The component may also be positioned in other different ways (rotated by 90 degrees or in other orientations), but the relative description of the space should be explained accordingly.

In addition, it needs to be noted that the use of such words as "first" and "second" to define components is merely intended to distinguish the corresponding components. Unless otherwise stated, such words have no special meaning and thus cannot be construed as limiting the protection scope of the present disclosure.

It should be noted that the terms "first", "second", and so on in the description and claims of this application and in the above accompanying drawings are intended to distinguish between similar objects but do not necessarily indicate a specific order or sequence. It should be understood that the data used in such a way may be exchanged under proper conditions to make it possible to implement the described examples of this application in sequences except those illustrated or described herein.

The technical principles of the present disclosure are described above with reference to the specific embodiments. These descriptions are merely intended to explain the principles of the present disclosure, and may not be construed as limiting the protection scope of the present disclosure in any way. Therefore, those skilled in the art may derive other specific implementations of the present disclosure without creative effort, but these implementations should fall within the protection scope of the present disclosure.

What is claimed is:

1. A compliant mechanical system for Mini/Micro chip mass transfer and packaging, comprising a flexure-based continuous ejector pin mechanism, wherein the flexure-based continuous ejector pin mechanism comprises a drive support plate, a mounting base, a first thorn die attach drive device, a second thorn die attach drive device, first flexible hinges, second flexible hinges, and a pricking pin;
   two upper hinge portions and two lower hinge portions horizontally protrude from a front side of the drive support plate;
   the upper hinge portions and the lower hinge portions are arranged in two groups up and down facing each other, and are respectively located on a left side and a right side of the drive support plate;
   the upper hinge portion is connected to the lower hinge portion directly there below through the first flexible hinge;
   the first thorn die attach drive device is mounted on the left side of the drive support plate; the second thorn die attach drive device is symmetrically mounted on the right side of the drive support plate;
   a left side and a right side of the mounting base are respectively hinged to the first thorn die attach drive device and the second thorn die attach drive device through the second flexible hinges; and
   an upper end of the pricking pin is vertically connected to a bottom of the mounting base.

2. The compliant mechanical system according to claim 1, wherein the first thorn die attach drive device is fixedly mounted on the left side of the drive support plate through an L-shaped mounting plate; the second thorn die attach drive device is fixedly mounted on the right side of the drive support plate through an L-shaped mounting plate;
   the first thorn die attach drive device and the second thorn die attach drive devices device are collinearly arranged in a horizontal direction; and the second flexible hinges located on the left side and the right side of the drive support plate are symmetrically arranged left and right with respect to an extension direction of the pricking pin in a vertical direction.

3. The compliant mechanical system according to claim 1, wherein two of the first flexible hinges are arranged in parallel between the upper hinge portion and the lower hinge portion directly therebelow; and the second flexible hinges are respectively hinged in parallel between the first thorn die attach drive device and the mounting base and between the second thorn die attach drive device and the mounting base.

4. The compliant mechanical system according to claim 1, wherein the first thorn die attach drive device and the second thorn die attach drive device are voice coil motors.

5. The compliant mechanical system according to claim 1, wherein the first flexible hinges are straight-beam hinges, and are of linear sheet structures having a uniform width and thickness; the second flexible hinges are arc flexible hinges, and are of linear strip structures; arc-shaped grooves are recessed in both ends of the arc flexible hinges, and groove surfaces of the arc-shaped grooves are arc surfaces; an extension direction of the arc grooves is horizontally arranged perpendicular to the drive support plate; and the first flexible hinges and the second flexible hinges are all made of aviation aluminum.

6. The compliant mechanical system according to claim 1, wherein the LED die is a Mini-LED die or a Micro-LED die.

* * * * *